United States Patent [19]

Sasaki

[11] 4,371,955
[45] Feb. 1, 1983

[54] CHARGE-PUMPING MOS FET MEMORY DEVICE

[75] Inventor: Nobuo Sasaki, Kawasaki, Japan

[73] Assignee: Fujitsu Limited, Kawasaki, Japan

[21] Appl. No.: 122,059

[22] Filed: Feb. 15, 1980

[30] Foreign Application Priority Data

Feb. 22, 1979 [JP] Japan .................................. 54-20094

[51] Int. Cl.³ ............................................ G11C 11/40
[52] U.S. Cl. .................................. 365/185; 365/178; 365/184
[58] Field of Search ................ 365/184, 185, 178; 357/54, 91

[56] References Cited

U.S. PATENT DOCUMENTS 4,222,063  9/1980  Rodgers .............................. 365/185
4,250,569  2/1981  Saski et al. ......................... 365/185

FOREIGN PATENT DOCUMENTS 52-21732  2/1977  Japan .................................. 365/184

Primary Examiner—James W. Moffitt
Attorney, Agent, or Firm—Staas & Halsey

[57] ABSTRACT

In a semiconductor layer of either conductivity type, a central region having a low threshold voltage and side regions having a high threshold voltage are formed between a source region and a drain region, for enabling a reliable writing-in of information.

12 Claims, 13 Drawing Figures

CHARGE-PUMPING MOS FET MEMORY DEVICE

BACKGROUND OF THE INVENTION

The present invention relates to a semiconductor memory device and, more particularly, to a semiconductor memory device of a charge pumping MOS FET type.

A prior art semiconductor memory device of the charge pumping MOS FET transistor type is illustrated in FIG. 1. This semiconductor memory device comprises a single-crystalline insulating substrate 1 of, for example, sapphire, a p type semiconductor layer 21 of silicon having an n+ type source region 22 and an n+ type drain region 23, a gate insulating layer 31 of silicon dioxide, and a gate electrode 4. A power source 41 is connected to the gate electrode 4. If the p type semiconductor layer 21 is negatively charged up with respect to the source region 22, information "1" is stored in the memory device, and if the potential of the p type semiconductor layer 21 is equal to the potential of the source region 22, information "0" is stored in the memory device.

The writing-in of information "1" into the device of FIG. 1 is effected as follows. The source region 22 is grounded, and the drain region 23 is supplied with a positive voltage $V_{DD}$. After a channel 211 has been formed in the portion of the p type semiconductor layer 21 directly beneath the gate insulating layer 31, by application of a positive voltage greater than the threshold voltage $V_{th}$ to the gate electrode 4, the gate voltage is quickly caused to fall below the threshold voltage $V_{th}$. At that time, a portion of the electrons in the channel 211 move to the p type semiconductor layer 21 and recombine with positive holes in the layer 21, so that the number of positive holes is reduced. Because of the reduction of the number of the positive holes, the layer 21 is caused to become negatively biased with respect to the source region 22. Because this bias establishes a reverse bias of the p-n junction between the layer 21 and the source region 22, the layer 21 remains negatively biased with respect to the source region 22. Accordingly, a writing-in of the information "1" has been performed.

A reading-out of the information stored in the device of FIG. 1 in accordance with the above described writing-in process is effected as follows. The above described bias can be regarded as a back gate bias. If there exists a back gate bias, the threshold voltage $V_{th}$ is enhanced. Thus, the threshold voltage $V_{th}$ of the device changes its value in accordance with the information "1" or the information "0" of the layer 21. When a voltage of, for example, 5 V is applied to the gate electrode 4 and a voltage of, for example, 5 V is applied to the drain electrode, the value of the current passing through the device is different in accordance with the written-in information "1" or "0". This is why the reading-out of the written-in information is possible.

An erasure of the written-in information "1" is effected by removing the negative bias from the layer 21. Alternatively, an erasure of the written-in information "1" is effected by applying a high voltage of, for example, 15 V to the drain region 23 to cause an avalanche multiplication, so as to inject holes into the layer 21.

However, the prior art semiconductor memory device of FIG. 1 has the disadvantage that, if the length of channel 211 is reduced in accordance with a reduction of the size of the semiconductor memory device, the greater part of the carriers in the channel 211 are caused to go back into either the source region 22 or the drain region 23 and, accordingly, the writing-in of the information becomes difficult and no effective charge pumping is carried out. This disadvantage occurs particularly in the case where the length of the channel 211 is reduced to shorter than 8 μm.

Prior art semiconductor memory devices of the charge pumping MOS FET type are described, for example, in the following two documents:

Nobuo Sasaki et al., "Charge Pumping SOS-MOS Transistor Memory", 1978 IEDM Technical Digest, Pages 356-359, Dec. 1978.

Japanese Patent Application Laid-open No. 54-5635 (corresponding to U.S. patent application No. 960,917 now U.S. Pat. No. 4,250,569).

SUMMARY OF THE INVENTION

The present invention has been proposed in order to eliminate the above described disadvantage.

The principal object of the present invention is to provide an improved structure for a semiconductor memory device, with which reliable writing-in of information is effected even when the length of the channel is short because of the small size of the semiconductor memory device.

In accordance with the present invention, a semiconductor memory device is provided which comprises an electrically floating semiconductor layer having a conductivity type, and a source region and a drain region formed from said semiconductor layer. A central region (having a low threshold voltage and side regions having a high threshold voltage) are also formed in the semiconductor layer between the source region and the drain region. Information is stored in the form of a bias voltage held in the semiconductor layer, and is read out in accordance with the difference in the read-out current corresponding to the difference of the bias voltage in the semiconductor layer.

DESCRIPTION OF THE PREFERRED EMBODIMENTS

Figure 1:
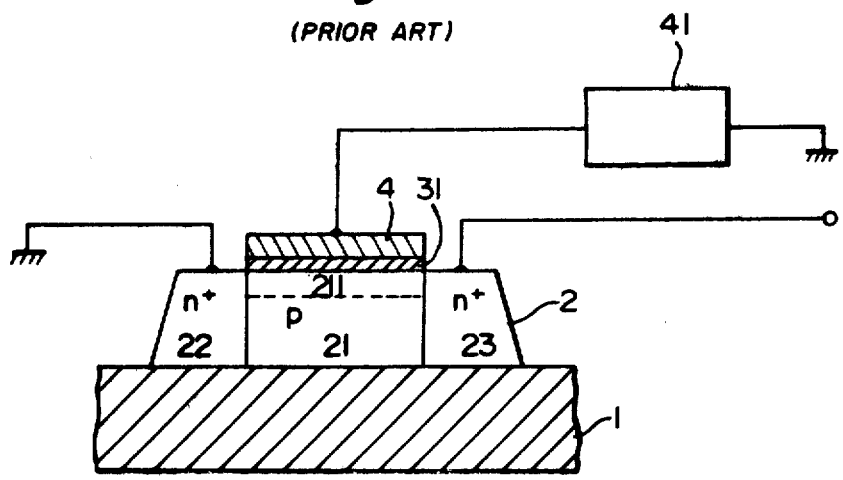
FIG. 1 illustrates the structure of a prior art semiconductor memory device.
Figure 2:
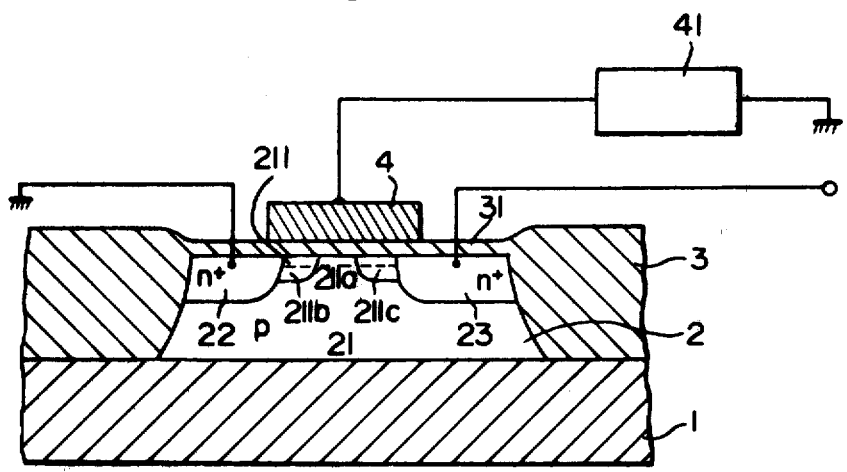
FIG. 2 illustrates the structure of a semiconductor memory device in accordance with an embodiment of the present invention.

The structure of the semiconductor memory device in accordance with an embodiment of the present invention is illustrated in FIG. 2. The semiconductor memory device of FIG. 2 comprises a single-crystalline insulating substrate 1, a p type semiconductor layer 21 of silicon, an n+ type source region 22, an n+ type drain region 23, a gate insulating layer 31, and a gate electrode 4. Between the source region 22 and the drain region 23, a central region 211a having the ordinary threshold voltage $V_{th1}$, and side regions 211b and 211c having a high threshold voltage $V_{th2}$ are formed.

In the structure illustrated in FIG. 2, when the voltage applied to the gate electrode 4 is removed (after the voltage has been applied to the gate electrode for forming the channel 211), the portions of the channel 211 in the side regions 211b and 211c pinch-off first, while the portions of the channel 211 in the central region 211a are maintained to keep the electrons in the channel 211, so that these electrons are stored in the region 21. Thus, not all of the electrical charges in the channel go back to the source region 22 and the drain region 23, and accordingly, an effective writing-in of the information is achieved even when the channel length is quite short.

A process for production of the semiconductor memory device of FIG. 2 is illustrated in FIGS. 3A through 3F.

Figure 3A:
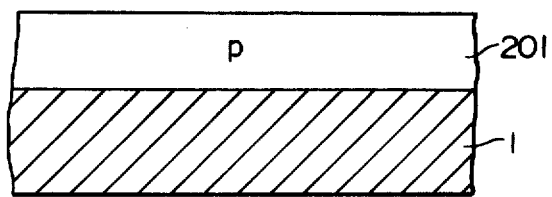
FIGS. 3A through 3F illustrate a process for production of the semiconductor memory device of FIG. 2.
Figure 3B:
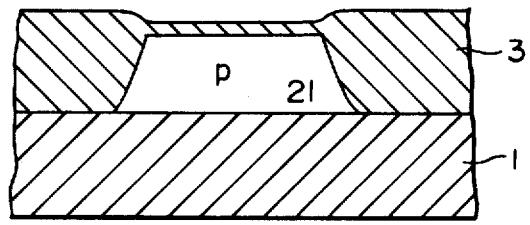
Figure 3C:
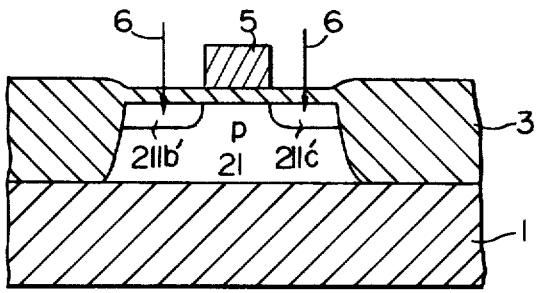
Figure 3D:
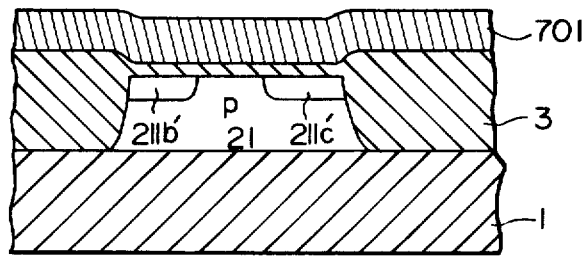
Figure 3E:
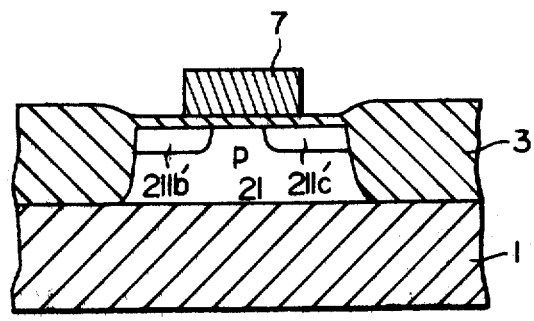
Figure 3F:
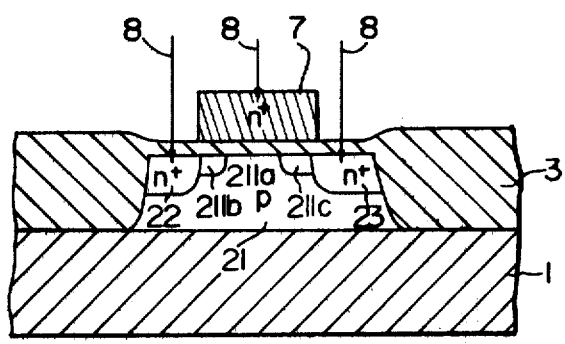

On a single-crystalline insulating substrate 1 of sapphire, a p type semiconductor layer 201 of silicon is formed (FIG. 3A). The p type semiconductor layer 21 of silicon is shaped and an insulating layer 3 of silicon dioxide is formed covering the shaped layer 21 (FIG. 3B). Using a masking layer 5 to cover the area in which the central region 211a (FIG. 3F) is to be formed, boron ions 6 are implanted into the regions 211b' and 211c' by an ion implantation process (FIG. 3C). The regions 211b' and 211c' have an increased threshold voltage $V_{th2}$. After the above mentioned ion implantation process, a layer 701 of polycrystalline silicon is formed (FIG. 3D), and a gate electrode 7 is shaped, by a patterning process which is applied to the layer of polycrystalline silicon (FIG. 3E), to cover the area in which the side regions 211b and 211c and the central region 211a (FIG. 3F) are to be situated (FIG. 3E). Then, another ion implantation 8 is effected to form the n+ type gate electrode 7, the n+ type source region 22, and the n+ type drain region 23 (FIG. 3F).

An alternative process for production of the semiconductor memory device of FIG. 2 is illustrated in FIGS. 4A through 4E.

Figure 4A:
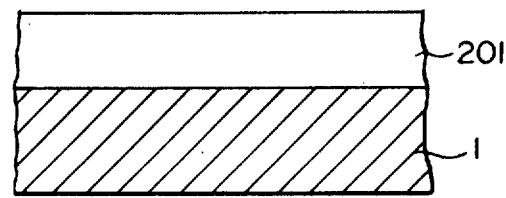
FIGS. 4A through 4E illustrate an alternative process for production of the semiconductor memory device of FIG. 2.
Figure 4B:
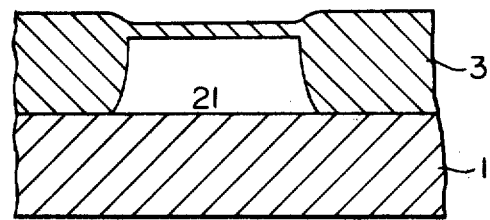
Figure 4C:
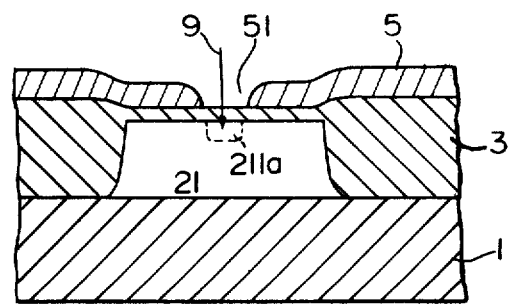
Figure 4D:
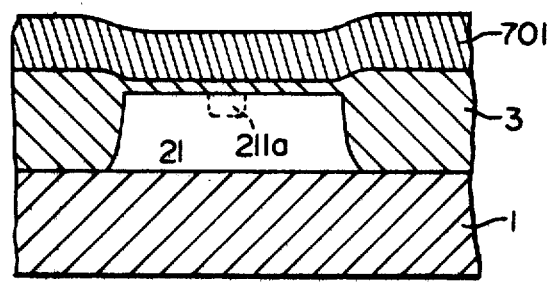
Figure 4E:
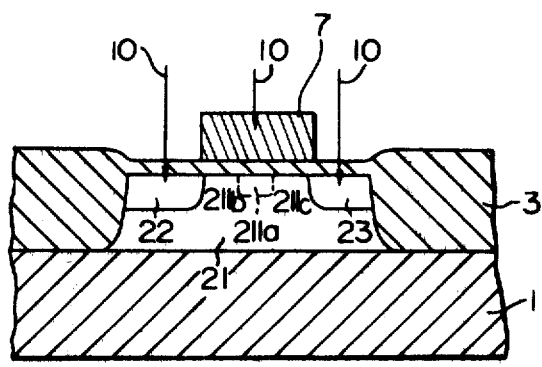

On a single-crystalline insulating substrate 1 of sapphire, a p type semiconductor layer 201 of silicon is formed (FIG. 4A). The p type semiconductor layer 21 of silicon is shaped and an insulating layer 3 of silicon dioxide is formed over it (FIG. 4B). A masking layer 5 covers the insulating layer 3, and has an aperture 51 corresponding to the central region 211a which is to be formed as illustrated in FIG. 4C. An ion implantation 9 is effected to implant donors of, for example, phosphorus into the central region 211a to reduce the threshold voltage of the central region 211a. After that, a layer 701 of polycrystalline silicon is formed (FIG. 4D), and then a gate electrode 7 is shaped by the patterning process applied to the layer of polycrystalline silicon 701, to cover the portion in which the side regions 211b and 211c and the central region 211a are to be situated. Finally, another ion implantation 10 is effected to form the n+ type gate electrode 7, the n+ type source region 22, and the n+ type drain region 23 (FIG. 4E).

Although in the above described embodiments of the present invention, the conductivity type of the semiconductor layer 21 is selected as p type, it is, of course, possible to select n type as the conductivity type of the semiconductor layer 21 with corresponding changes of n type regions to p type regions, donors to acceptors, and acceptors to donors, respectively.

What is claimed is:
1. A semiconductor memory device comprising:
an electrically floating semiconductor layer;
a source and a drain region formed in said semiconductor layer;
a gate insulating layer formed on said semiconductor layer and a gate electrode formed on said insulating layer;
said memory device having a threshold voltage for conduction of a first value and normally storing one of "0" and "1" information values;
means for selectively applying a gate voltage to said gate electrode exceeding said first threshold voltage value of said device to produce a bias voltage in said semiconductor layer, said semiconductor layer storing said bias voltage produced by said gate voltage and establishing thereby a threshold voltage of a second value different from said first value, thereby to store the other of said "0" and "1" information values;
said memory device selectively storing "0" and "1" information values in accordance with a desired, predetermined relationship of said "0" and "1" information values and said different bias and corresponding threshold voltage values;
said semiconductor layer further comprising a central region having a low threshold voltage and side regions having a high threshold voltage, formed in said semiconductor layer between said source region and said drain region;
said first voltage threshold value being determined by said high threshold voltage of said side regions, and said side regions undergoing pinch-off prior to pinch-off occurring in said central region upon removal of said selectively applied gate voltage and
means for producing a read-out current from said memory device, the level of the read-out current differing in accordance with the different bias and corresponding threshold voltage values and thereby affording read-out of the information value stored in said memory device.

2. The device of claim 1, further comprising an insulating substrate below said semiconductor layer.

3. The device of claim 2, wherein said insulating substrate comprises sapphire.

4. The device of claim 1, 2, or 3, wherein the distance between said source region and said drain region is less than 8 microns.

5. The device of claim 1, 2, or 3, wherein said semiconductor layer is of silicon.

6. The device of claim 1, 2, or 3, wherein said semiconductor layer is of conductivity type p.

7. The device of claim 1, 2, or 3, wherein said semiconductor layer is of conductivity type n.

8. The device of claim 6, wherein said source region and said drain region are of conductivity type n+.

9. The device of claim 7, wherein said source region and said drain region are of conductivity type p+.

10. A semiconductor memory device for storing information, comprising:
an electrically floating semiconductor layer;
a source region and a drain region, formed in said semiconductor layer;
a central region having a low threshold voltage and side regions having a high threshold voltage, formed in said semiconductor layer between said source region and said drain region, said device having a first threshold value for conduction determined by said high threshold voltage of said side regions;

a gate insulating layer formed atop said semiconductor layer;

a gate electrode formed atop said gate insulating layer above said central and side regions;

means for selectively applying a gate voltage to said gate electrode in excess of said first threshold voltage value of said device to establish a bias voltage in said central region of said semiconductor layer and said semiconductor layer storing said bias voltage thus established, for writing in a predetermined one of the information values "1" and "0";

means for selectively applying a voltage between said source region and said drain region to enable a source to drain current to be conducted, the value of said current differing in accordance with the presence or absence of a bias voltage stored in said semiconductor layer in accordance with the prior, selective application of a gate voltage thereby to enable read-out of the information value stored in said device.

11. The device of claim 10, further comprising means for applying an avalanche voltage between said source and said drain, whereby the information stored in said semiconductor memory device is erased.

12. The device of claim 11, further comprising means for removing the stored bias voltage from said semiconductor layer, whereby information written into said semiconductor memory device is erased.

* * * * *